US010615800B1

(12) United States Patent
Chen et al.

(10) Patent No.: US 10,615,800 B1
(45) Date of Patent: Apr. 7, 2020

(54) METHOD AND APPARATUS FOR IMPLEMENTING CONFIGURABLE STREAMING NETWORKS

(71) Applicant: Altera Corporation, San Jose, CA (US)

(72) Inventors: Doris Tzu Lang Chen, Toronto (CA); Deshanand Singh, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 16/254,407

(22) Filed: Jan. 22, 2019

Related U.S. Application Data

(63) Continuation of application No. 15/352,406, filed on Nov. 15, 2016, now Pat. No. 10,224,934, which is a continuation of application No. 14/510,733, filed on Oct. 9, 2014, now Pat. No. 9,515,658.

(51) Int. Cl.
*H03K 19/177* (2006.01)
*H03K 19/17756* (2020.01)

(52) U.S. Cl.
CPC .............................. *H03K 19/17756* (2013.01)

(58) Field of Classification Search
CPC ................................................ H03K 19/17756
USPC ......................................................... 326/38
See application file for complete search history.

(56) References Cited

U.S. PATENT DOCUMENTS

| 7,032,103 | B2 | 4/2006 | Eslick et al. |
| 7,835,584 | B1 | 11/2010 | Nancekievill |
| 9,053,266 | B2 * | 6/2015 | Zievers ............... G06F 17/5027 |
| 9,100,012 | B1 * | 8/2015 | Chen ................... G06F 17/5054 |
| 9,483,282 | B1 | 11/2016 | Vandervennet et al. |
| 9,515,658 | B1 | 12/2016 | Chen et al. |
| 9,584,129 | B1 * | 2/2017 | Walstrom ......... H03K 19/17752 |
| 2006/0136570 | A1 | 6/2006 | Pandya |
| 2008/0278197 | A1 * | 11/2008 | Murotake ............. G06F 9/4401 |
| | | | 326/38 |
| 2012/0096252 | A1 | 4/2012 | Arditti et al. |
| 2015/0222533 | A1 | 8/2015 | Birrittella et al. |
| 2015/0370582 | A1 | 12/2015 | Kinsella et al. |
| 2016/0132441 | A1 | 5/2016 | Styles et al. |
| 2016/0173104 | A1 | 6/2016 | Vassiliev |
| 2016/0335120 | A1 | 11/2016 | Gupta et al. |

* cited by examiner

*Primary Examiner* — Don P Le
(74) *Attorney, Agent, or Firm* — Fletcher Yoder, P.C.

(57) ABSTRACT

A method of configuring a programmable integrated circuit device. A channel source within the virtual fabric is configured to receive input data from a first kernel outside of the virtual fabric and on the programmable integrated circuit device, and a channel sink within the virtual fabric is configured to transmit output data to the first kernel. The configuring of the channel source is modified such that the channel source receives input data from a second kernel in response to detecting a change in operation of the programmable integrated circuit device.

20 Claims, 7 Drawing Sheets

METHOD AND APPARATUS FOR IMPLEMENTING CONFIGURABLE STREAMING NETWORKS

CROSS-REFERENCE TO RELATED APPLICATIONS

This application is a continuation of U.S. patent application Ser. No. 15/352,406, entitled "METHOD AND APPARATUS FOR IMPLEMENTING CONFIGURABLE STREAMING NETWORKS", filed Nov. 15, 2016, which is a continuation of U.S. patent application Ser. No. 14/510,733, now U.S. Pat. No. 9,515,658, entitled "METHOD AND APPARATUS FOR IMPLEMENTING CONFIGURABLE STREAMING NETWORKS", filed Oct. 9, 2014, both of which are herein incorporated by reference in their entireties.

FIELD OF THE INVENTION

This invention relates to techniques for implementing applications with dynamic streaming networks on programmable integrated circuit devices such as a field-programmable gate array (FPGAs) or other types of programmable logic devices (PLDs).

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

At some point, such devices began to be provided with embedded blocks of random access memory that could be configured by the user to act as random access memory, read-only memory, or logic (such as P-TERM logic). Moreover, as programmable devices have become larger, it has become more common to add dedicated circuits on the programmable devices for various commonly-used functions. Such dedicated circuits could include phase-locked loops or delay-locked loops for clock generation, as well as various circuits for various mathematical operations such as addition or multiplication. This spares users from having to create equivalent circuits by configuring the available general-purpose programmable logic.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, including those with the aforementioned dedicated circuitry, it would be impractical to attempt to lay out the logic without such software. Such software also now commonly includes pre-defined functions, commonly referred to as "cores," for configuring certain commonly-used structures, and particularly for configuring circuits for mathematical operations incorporating the aforementioned dedicated circuits. For example, cores may be provided for various trigonometric or algebraic functions.

Although available programming software allows users to implement almost any desired logic design within the capabilities of the device being programmed, most such software requires knowledge of hardware description languages such as VHDL or Verilog. However, many potential users of programmable devices are not well-versed in hardware description languages and may prefer to program devices using a higher-level programming language.

SUMMARY OF THE INVENTION

One high-level programming language that may be adopted for configuring a programmable device is OpenCL (Open Computing Language), although use of other high-level languages, and particularly any other high-level synthesis languages, including C, C++, Fortran, C#, F#, BlueSpec and Matlab, also is within the scope of this invention.

In OpenCL, computation is performed using a combination of a host and kernels, where the host is responsible for input/output (I/O) and setup tasks, and kernels perform computation on independent inputs. Where there is explicit declaration of a kernel, and each set of elements to be processed is known to be independent, each kernel can be implemented as a high-performance hardware circuit. Based on the amount of space available on a programmable device such as an FPGA, the kernel may be replicated to improve performance of an application.

A kernel compiler converts a kernel into a hardware circuit, implementing an application from an OpenCL description, through hardware generation, system integration, and interfacing with a host computer. Therefore, in accordance with embodiments of the present invention, systems and methods are described for configuring the communication topology between computational kernels. A programmable integrated circuit device is configured by instantiating a virtual fabric on the programmable integrated circuit device. A channel source within the virtual fabric is configured to receive input data from a first kernel outside of the virtual fabric and on the programmable integrated circuit device, and a channel sink within the virtual fabric is configured to transmit output data to the first kernel. The configuring of the channel source is modified such that the channel source receives input data from a second kernel in response to detecting a change in operation of the programmable integrated circuit device.

In some embodiments, the first kernel is in a plurality of kernels that are included in a partial reconfiguration block that allows for the plurality of kernels to be removed, added, or exchanged during the modifying. The second kernel may be in the plurality of kernels that are included in the partial reconfiguration block. Another partial reconfiguration block may include another plurality of kernels that process data during the modifying.

In some embodiments, the virtual fabric includes a plurality basic blocks, where a first subset of the basic blocks is a plurality of channel sources including the channel source, a second subset of the basic blocks is a plurality of channel sinks including the channel sink, and a third subset of the basic blocks is a plurality of channel buffers. At least one channel buffer in the plurality of channel buffers may form a first-in-first-out memory between one of the plurality of channel sources and one of the plurality of channel sources. A number of channel sources in the plurality of channel sources may be greater than or equal to a number of outputs on a plurality of kernels including the first and second kernels on the programmable integrated circuit device. A number of channel sinks in the plurality of channel sinks may be greater than or equal to a number of inputs on a plurality of kernels including the first and second kernels on the programmable integrated circuit device.

In some embodiments, the configuring of the channel sink is modified by configuring the channel sink to transmit output data to the second kernel. The configuring of the channel source and of the channel sink may occur at runtime.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
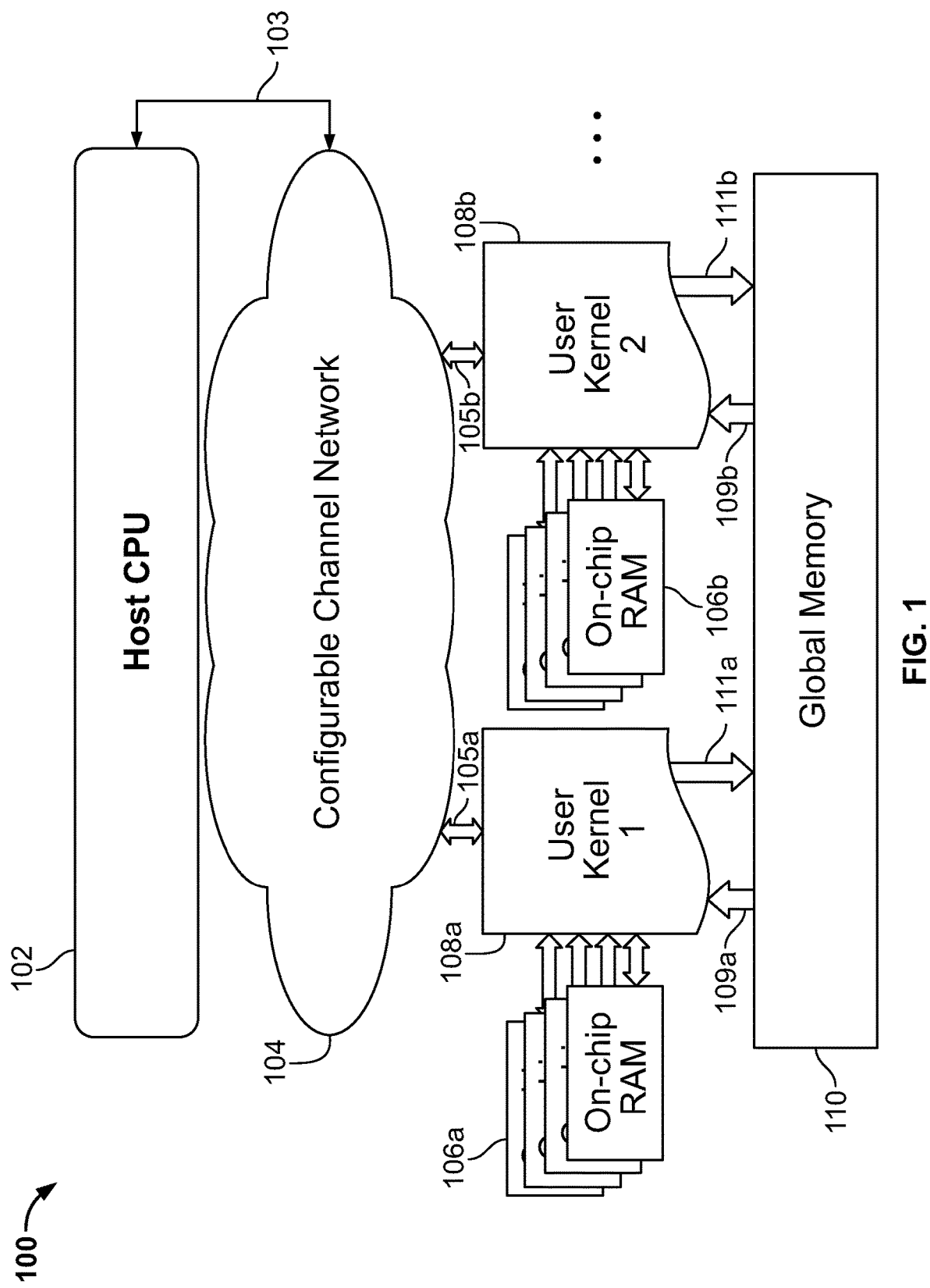
FIG. 1 shows a diagram of a host configurable channel topology, in accordance with some embodiments of the present disclosure.

In OpenCL, an application is executed in two parts—a host and a kernel. The host is a program responsible for processing I/O requests and setting up data for parallel processing. When the host is ready to process data, it can launch a set of threads on a kernel, which represents a unit of computation to be performed by each thread.

Each thread executes a kernel computation by loading data from memory as specified by the host, processing those data, and then storing the results back in memory to be read by the user, or by the user's application. In OpenCL terminology, a kernel and the data on which it is executing are considered a thread. Results may be computed for a group of threads at one time. Threads may be grouped into workgroups, which allow data to be shared between the threads in a workgroup. Normally, no constraints are placed on the order of execution of threads in a workgroup.

For the purposes of data storage and processing, each kernel may have access to more than one type of memory—e.g., global memory shared by all threads, local memory shared by threads in the same workgroup, and private memory used only by a single thread.

Execution of an OpenCL application may occur partially in the host program and partially by executing one or more kernels. For example, in vector addition, the data arrays representing the vectors may be set up using the host program, while the actual addition may be performed using one or more kernels. The communication between these two parts of the application may facilitated by a set of OpenCL functions in the host program. These functions define an interface between the host and the kernel, allowing the host program to control what data is processed and when that processing begins, and to detect when the processing has been completed.

A programmable device such as an FPGA may be programmed using a high-level language such as OpenCL by starting with a set of kernels and a host program. The kernels are compiled into hardware circuit representations using a Low-Level Virtual Machine (LLVM) compiler that may be extended for this purpose. The compilation process begins with a high-level parser, such as a C-language parser, which produces an intermediate representation for each kernel. The intermediate representation may be in the form of instructions and dependencies between them. This representation may then be optimized to a target programmable device.

An optimized LLVM intermediate representation is then converted into a hardware-oriented data structure, such as in a control flow graph, a data flow graph, or a control-data flow graph. This data structure represents the kernel at a low level, and contains information about its area and maximum clock frequency. The flow graph can then be optimized to improve area and performance of the system, prior to RTL generation which produces a Verilog HDL description of each kernel.

The compiled kernels are then instantiated in a system that preferably contains an interface to the host as well as a memory interface. The host interface allows the host program to access each kernel. This permits setting workspace parameters and kernel arguments remotely. The memory serves as global memory space for an OpenCL kernel. This memory can be accessed via the host interface, allowing the host program to set data for kernels to process and retrieve computation results. Finally, the host program may be compiled using a regular compiler for the high-level language in which it is written (e.g., C++).

Returning to individual parts of the process, to compile kernels into a hardware circuit, each kernel is implemented from basic block modules. Then, each basic block module is converted into a hardware module. Each basic block, once instantiated, processes the data according to the instructions contained within the block and produces output that can be read by other basic blocks, or directly by a user. Once each kernel has been described as a hardware circuit, a design may be created including the kernels as well as memories and an interface to the host platform. To prevent pipeline overload, the number of threads allowed in a workgroup, and the number of workgroups allowed simultaneously in a kernel, may be limited.

Although the generalized method described above can be used to create efficient hardware circuit implementations of user logic designs using a high-level language, such as OpenCL, the required compile time can compare unfavorably to that required for convention hardware-description-language-based programming. Depending on the particular user logic design, compilation may take hours or even days, as compared to seconds or minutes for HDL-based programming. The problem of long compile times may be magnified by the need to periodically change a logic design, particularly during development.

In the host-centric model that is described above, the host coordinates kernel invocations and data transfers. Such a system has drawbacks, such as having to require that intermediate data communicated between kernels needs to be transferred through global memory. Because high bandwidth and high power are necessary for high performance, practical limits on the sizes of data buffers may limit the types of applications that may be implemented using host-centric models. Another drawback includes having to require the host synchronizes and coordinates activities when there are multiple computational kernels operating in parallel and communicating with the host or with one another.

Sometimes, OpenCL programs include multiple kernels that require acceleration. In particular, the host CPU may be attached to an accelerator device, which may include one or more of a graphics processing unit (GPU), CPU, or FPGA. The accelerator device may be used to offload one or more computational kernels of an application to another device.

The use of streaming programming models allows developers to implement extremely efficient processes on integrated circuits such as FPGAs. Some types of applications cannot be expressed using a streaming network that has a static topology, while a dynamic topology for the network may handle these applications. In applications that use streaming, there is no need for a host-centric model in which in order to process data, a microprocessor is required to load data in, process the data, and write the processed data out to memory. Instead, streaming is much more efficient by only requiring data to flow in and be processed, and allowing the data to flow out. Rather than having an external controller handle the data processing, the integrated circuit such as an FPGA, is able to process the data as soon as the data flows in.

The systems and methods of the present disclosure provide a mechanism that allows OpenCL programs on FPGAs to dynamically adapt to the needs of an application. Being able to adapt dynamically is beneficial at least because at least one single hardware implementation may be required for each kernel in the OpenCL program. Depending on the needs of the application, it may be desirable to replicate kernels to optimize the overall performance of the system. Moreover, the characteristics of the application may not be known until runtime, or may change as the program progresses. In this case, it is advantageous to be able to dynamically adapt to new information or changes to the characteristics.

FIG. 1 shows a diagram 100 of a host configurable channel topology. The diagram 100 includes a host CPU 102, a configurable channel network 104, two on-chip RAMS 106*a* and 106*b* (generally, on-chip RAM 106), two user kernels 108*a* and 108*b* (generally, user kernel 108), and a global memory 110. In FIG. 1, the host CPU 102 communicates with the configurable channel network over the channel 103, and the configurable channel network communicates with the user kernels 108 over the channels 105. Furthermore, the user kernels 108 read data from the global memory 110 using the read channels 109*a* and 109*b* (generally, read channel 109), and write data to the global memory 110 using the write channels 111*a* and 111*b* (generally, write channel 111). While FIG. 1 shows only one host CPU 102, one configurable channel network 104, two user kernels 108, two on-chip RAMs 106, and one global memory 110, one of ordinary skill in the art will understand that any number of any of the components shown in FIG. 1 may be used without departing from the scope of the present disclosure.

It may be desirable for an application to reconfigure or update the communication topology between computational kernels at runtime. In an example, multi-function printers, copiers, and scanners may require being able to switch between different modes (such as a printing mode or a scanning mode). In this case, the flow of data and the image processing steps may be different in the different modes, but certain steps may be shared or reused across modes. For example, a scan mode may include three steps: (1) retrieving image data from a scan sensor, (2) applying a first one-dimensional filter, and (3) applying a second one-dimensional filter. A print mode on the same machine may include four steps: (1) retrieving image stream data, (2) applying a first one-dimensional filter, (3) applying a second one-dimensional filter, and (4) controlling a motor head for printing the filtered data. In this example, the second and third steps of the scan mode are equivalent to the second and third steps of the print mode, such that the same filter kernels may be reused in each mode, but with different data inputs and outputs. Rather than implementing seven different computational kernels, where each kernel performs one step in the two modes (e.g., three kernels for the scan mode and four kernels for the print mode), some of the kernels may be recycled to be used in both modes by reconfiguring the topology of the network.

The host configurable channel topology shown in FIG. 1 is able to be modified based on a mode of operation. For example, the following code may be used to define the data flow based on the mode.

if (mode==PRINT)

```
{
  setupDataFlow(
    Image Stream -> Filter -> Filter -> Motor Control
  );
}
else
if (mode == SCAN)
{
  setupDataFlow(
    Scanner -> Filter -> Filter
  );
}
```

In this example of code implemented by the host CPU 102, the setupDataFlow function communicates with the configurable channel network 104 to route channels from sources to sinks based on the needs of the application. The examples are shown and described herein for illustrative example only, and one of ordinary skill in the art will understand that the present disclosure may be used in any application in which multiple modes may be used, where the communication topology may be different for different modes.

Figure 2:
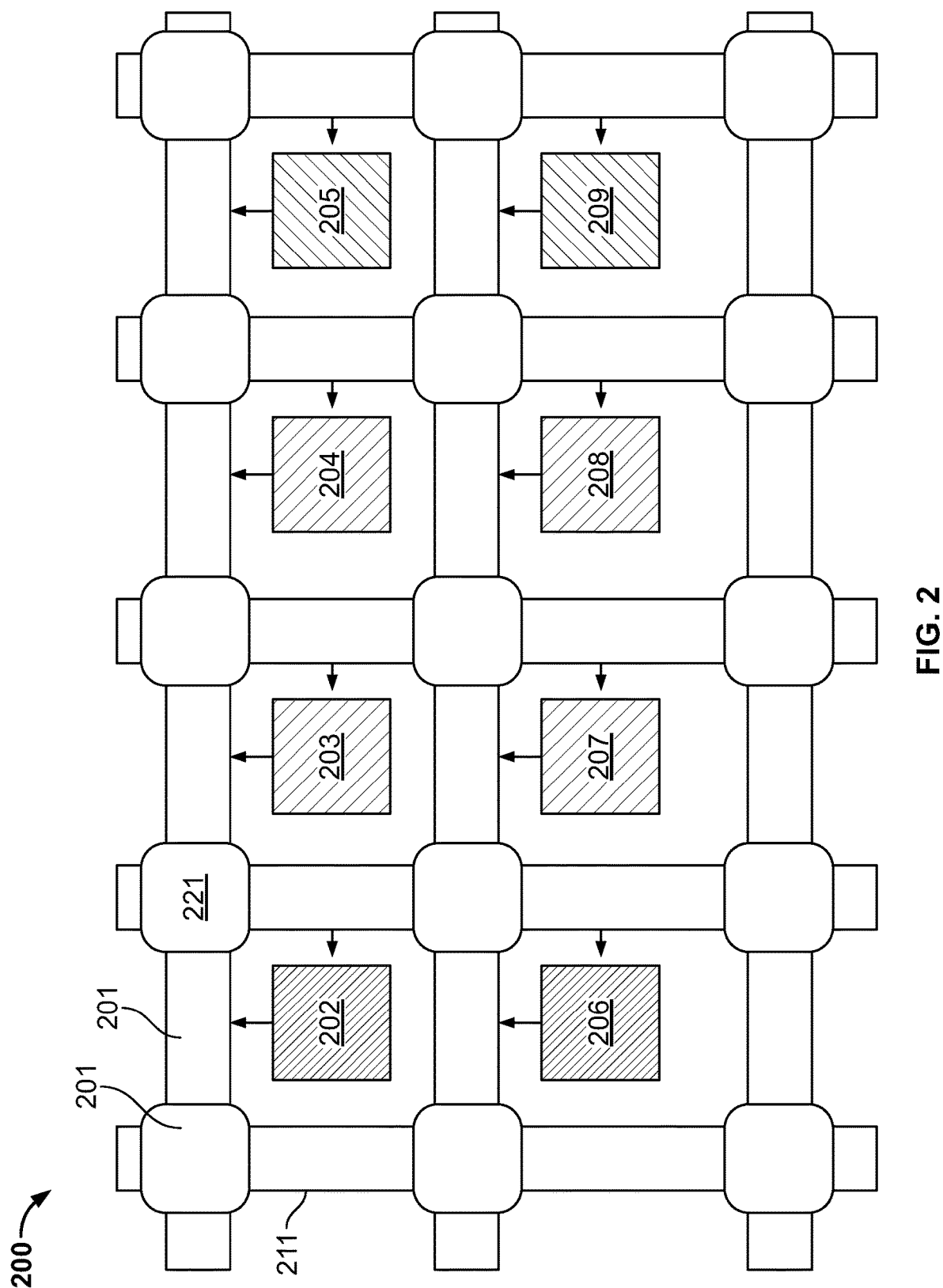
FIG. 2 shows a diagram of an example virtual fabric, in accordance with some embodiments of the present disclosure.

FIG. 2 shows a diagram of an example virtual fabric 200. The virtual fabric 200 may be used to implement the configurable connectivity and buffering in the configurable channel network 104 in FIG. 1. As shown in FIG. 2, the virtual fabric includes an array of functional units, or basic blocks, surrounded by a configurable routing network. In particular, the virtual fabric 200 may be a high-level language representation of a coarse-grained virtual FPGA including an interconnect network 201 of buses 211 and routing switches 221, and a relatively smaller number of basic blocks 202-209 representing various combinations of logic elements, implemented on top of a physical FPGA having a relatively larger number of individual logic elements. For example, the basic blocks 202 and 206 may correspond to channel source blocks, the basic blocks 203, 204, 207, and 208 may correspond to channel buffer blocks, and the basic blocks 205 and 209 may correspond to channel sink blocks.

The virtual fabric is described in U.S. patent application Ser. No. 13/369,836, which is incorporated herein by reference in its entirety. The virtual fabric 200 may be entirely implemented in soft logic and pre-synthesized. The configurable routing network including the network 201 of buses 211 and routing switches 221 may be configured at runtime, such that the connectivity between functional units in the array is set at runtime. By creating the appropriate connectivity at runtime, the virtual fabric 200 may be reconfigured to implement different flows when desired.

As shown in FIG. 2, the basic blocks 202-209 are shown as channel sources, channel buffers, or channel sinks. Channel sources, channel buffers, and channel sinks are examples of functions that may be performed by basic blocks. In general, the basic blocks may perform one or more other functions, such as mathematical (e.g., addition, subtraction, multiplication, or trigonometric functions, for example) or logic (e.g., AND, OR, or XOR, for example) functions. Furthermore, a basic block may perform any suitable number of functions, including channel-related functions, mathematical functions, logic functions, or a combination thereof.

In some embodiments, the virtual fabric, such as that shown in FIG. 2, may be built by first implementing the grid in the interconnect network 201 at the fabrication stage. At this stage, the virtual fabric only includes the interconnect network 201 with the various basic blocks 202-209, but the connections indicated by the arrows entering and exiting each basic block 202-209 are not yet implemented. After the virtual fabric is built, configuration registers in the virtual fabric may be used to implement the arrows shown in FIG. 2 at runtime. By using the virtual fabric, which may be implemented in the hardware at the fabrication stage, compilation time is significantly reduced, and flow graph representations may be efficiently mapped to the virtual fabric hardware.

In some embodiments, a set of multiple virtual fabrics may be considered a library of virtual fabrics. Different virtual fabrics in the library may have different distributions of different types of basic blocks. For example, the library may include a set of different basic virtual fabrics, of which fabric 200 is just one example, each of which has a different distribution of basic blocks 202-209 including basic mathematical functions along with multiplexing logic.

Streaming programming models allow developers to implement efficient algorithms on integrated circuits such as FPGAs. In particular, compared to having a microprocessor orchestrate the control of data movement and computation, the use of a topology that may change dynamically is more efficient. Furthermore, some application classes cannot be expressed using a static topology of the streaming network, whereas that a dynamic topology offers greater flexibility. The systems and methods of the present disclosure provide techniques for implementing applications with dynamic streaming networks on integrated circuit devices such as FPGAs.

In some implementations, rather than using global memory to store intermediate data that is transferred from input/output devices or from kernels, channels may be used to transfer this data. As used herein, a channel refers to a communication link from a source to a destination, and may include any one or more of a FIFO buffer, a stream, and a pipe.

Channels may be used as input or output arguments for kernels. For example, an example of an OpenCL code implementing a computational kernel may include:

kernel function(channel float X, channel float Y)
{
   float value=read_channel(X);
   float output=f(value);
   write_channel(Y);
}

In this example code, X and Y correspond to reference channels that carry floating point information. The command read_channel removes the first element that was pushed into the channel and returns the value of the first element. The command write_channel pushes a value into a channel, and the written values may be consumed or read by another computational kernel.

There are several applications in which the use of channels is beneficial. For example, any application that does not require data to persist (such that there is no need to store or preserve intermediate data) may use channels. In one example, channels may be used in a polyphase filter bank, such as one that is used in RADAR and astronomy. The polyphase filter bank may include an FIR filter block, followed by an FFT computation block, and channels may be used to implement these blocks. In another example, channels may be used in Monte Carlo financial simulations, or in image filtering. When an application requires sorting, the application may require being able to write at least N elements to the channel in order to guarantee efficiency and to avoid dead lock. The minimum size N of a channel may be referred to as the channel depth. The examples described herein are for illustrative purposes only, and one of ordinary skill in the art will understand that the systems and methods of the present disclosure may be used in any application in which channels are used.

The configurable channel network 104 of FIG. 1 may be implemented as the virtual fabric 200, and may include channel sources and channel destinations and require routes to originate at channel sources and end at channel destinations. Furthermore, additional FIFO buffering may be used to ensure efficiency and to avoid deadlock. In deadlock, a first kernel may be waiting for data from a second kernel, and the second kernel may be waiting for data from the first kernel, resulting in an endless loop. Deadlock may occur if a FIFO buffer has a channel depth that is too low and fills up, stalling one or more kernels and lowering efficiency. The channel depth of certain FIFO buffers may be increased to suit the needs of the application. Applications may use tens to hundreds of channels, so the configurable channel network 104 may be required to be able to scale appropriately to handle a suitable number of channels for an application. Moreover, the configurable channel network 104 may be required to be able to be efficiently and quickly reconfigured by the host CPU 102.

Figure 3:
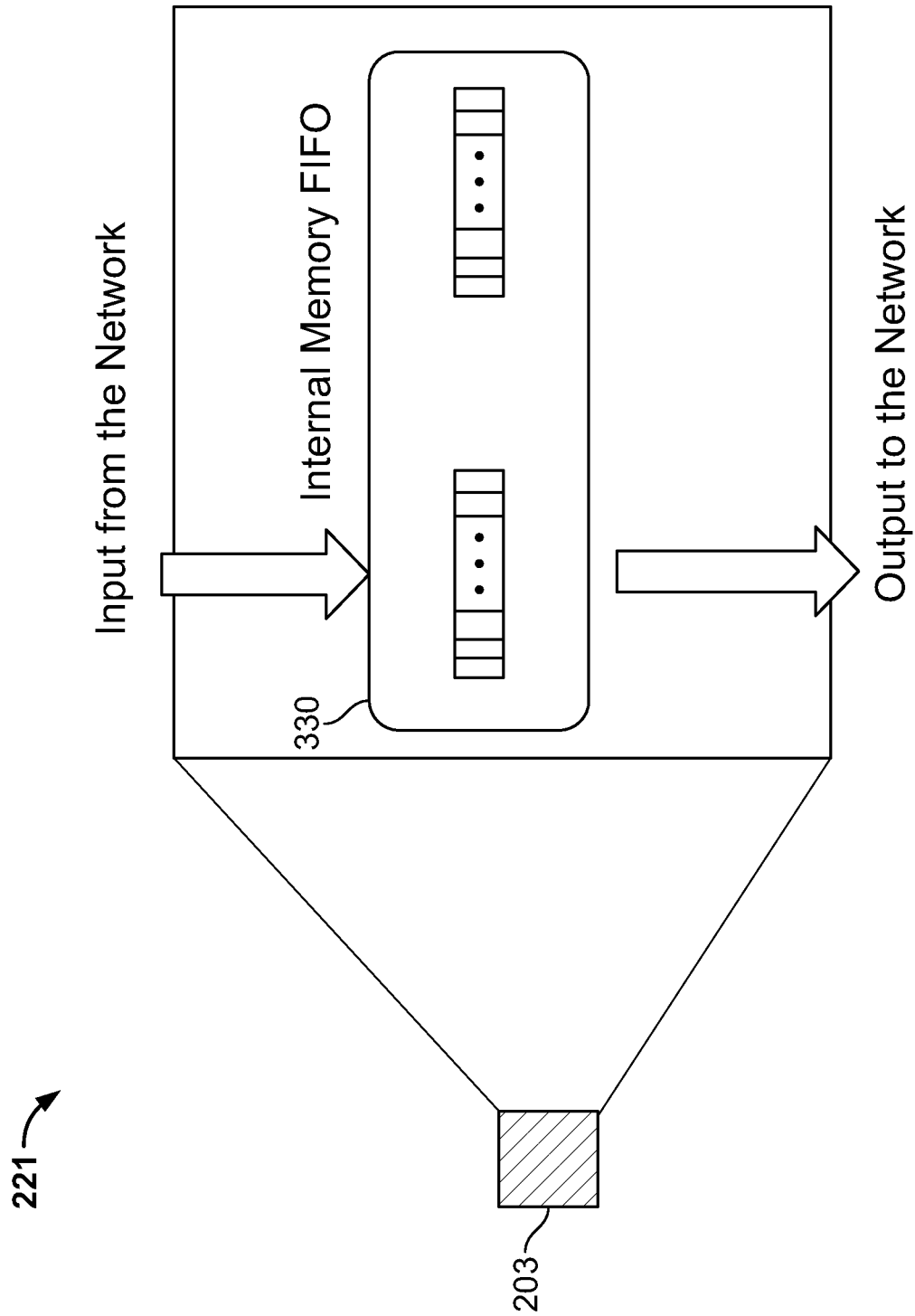
FIG. 3 shows a diagram of an example channel buffer block, in accordance with some embodiments of the present disclosure.

FIG. 3 shows a diagram of an example channel buffer block 221, which may be used as any of the channel buffers for the basic blocks 203, 204, 207, and 208 in FIG. 2. The channel buffer block 221 receives input from and provides output to the network, which corresponds to the network 201 in FIG. 2 including buses 211 and routing switches 221. As shown in FIG. 3, the channel buffer block 221 includes internal memory FIFO block 330, which may include a single FIFO buffer, or multiple parallel FIFO buffers, and may be associated with one or more channel depths.

Figure 4:
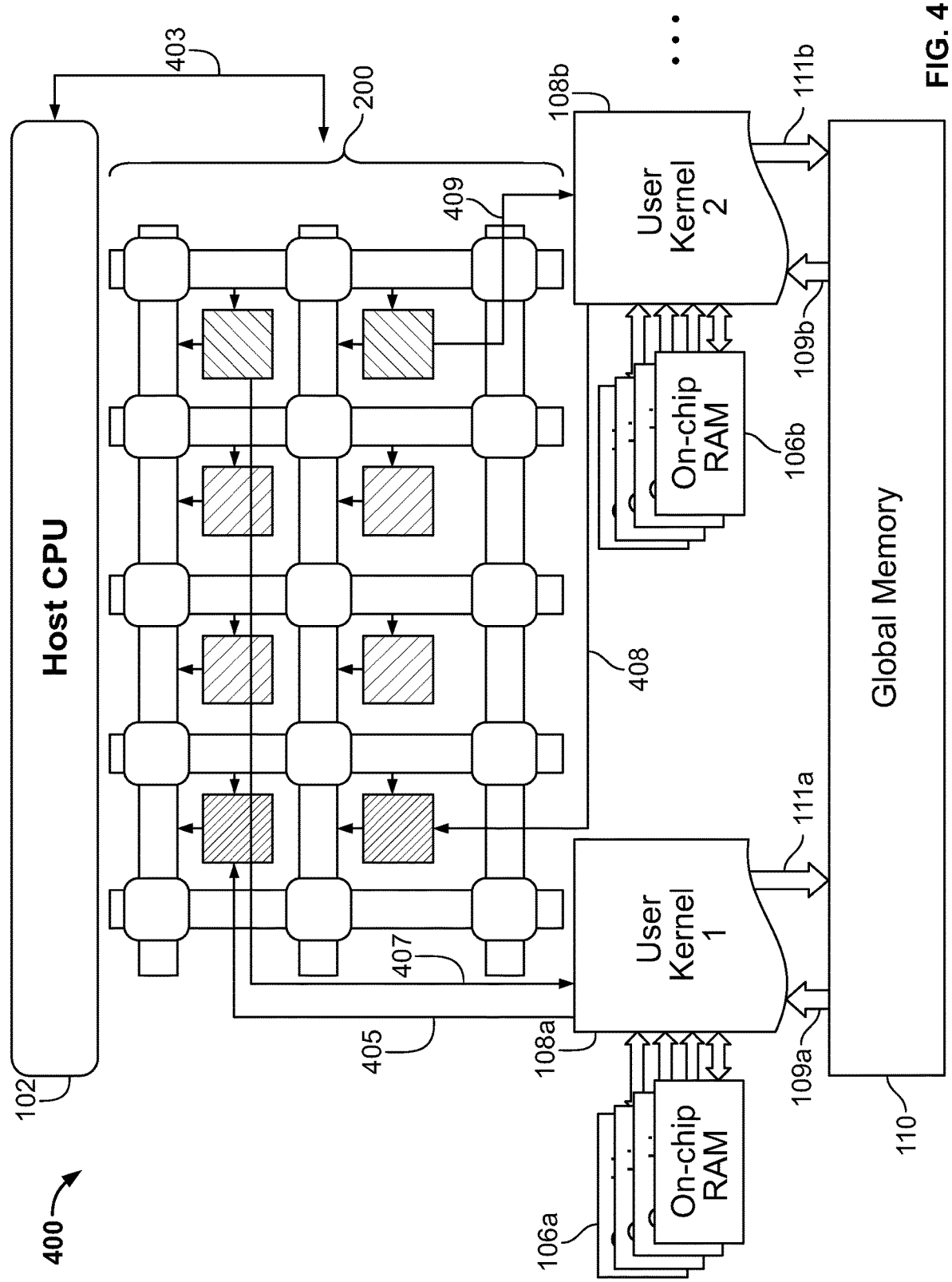
FIG. 4 shows a diagram of an example use model where the channel dataflow is mapped to a virtual fabric, in accordance with some embodiments of the present disclosure.

FIG. 4 shows a diagram of an example use model where the channel dataflow is mapped to a virtual fabric. Most of the components shown in FIG. 4 are the same as the components shown in FIG. 1, except that the configurable channel network 104 is replaced with the virtual fabric 200, which communicates with the host CPU 102 over the channel 403. Furthermore, as shown in FIG. 4, the user kernel 111a transmits data over channel 405 to a channel source in the virtual fabric 200 and receives data over channel 407 from a channel sink in the virtual fabric 200. Moreover, the user kernel 111b transmits data over channel 408 to a channel source in the virtual fabric 200 and receives data over channel 409 from a channel sink in the virtual fabric 200. The kernels, the virtual fabric, and their inputs and outputs are shown in FIG. 4 for illustrative purposes only, and one of ordinary skill in the art will understand that any number of kernels with any type of suitable connection to a virtual fabric may be used without departing from the scope of the present disclosure.

Examples of how a high level program may be transformed into a data flow graph, which may be mapped to the virtual fabric is described in U.S. patent application Ser. No. 13/369,836, which is incorporated herein by reference in its entirety. In the use model described herein, the host CPU 102 may explicitly create a dataflow graph that dictates the communication topology of the computational kernels 108. In an example, the setupDataFlow function described above is a function that is representative of a dataflow graph that may be created by the host CPU 102. The techniques described in U.S. patent application Ser. No. 13/369,836 may be used to map the dataflow graph to a specialized virtual fabric.

Figure 5:
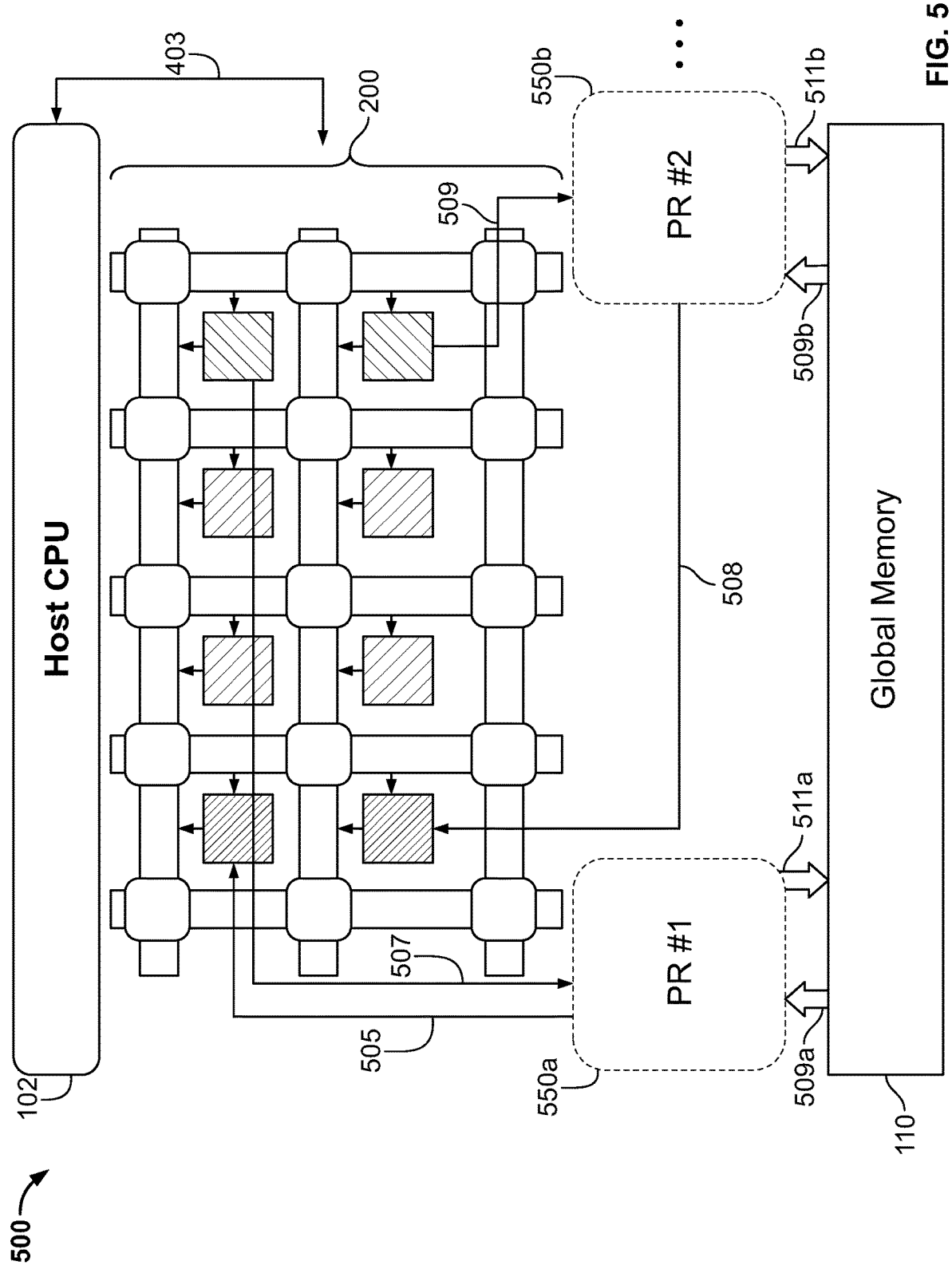
FIG. 5 shows a diagram of an example use model of the configurable channel topology being used with partial reconfiguration, in accordance with some embodiments of the present disclosure.

FIG. 5 shows a diagram of an example use model of the configurable channel topology being used with partial reconfiguration. FIG. 5 includes the same components as FIG. 4, except that the user kernels 108 and 106 of FIG. 4 are replaced with two partial reconfiguration blocks 550a and 550b (generally, partial reconfiguration block 550). As used herein, a partial reconfiguration block 550 refers to a region on a chip where the logic may be reconfigured on the fly.

In an example, using partial reconfiguration of integrated circuit devices such as FPGAs may dynamically replace parts of an existing OpenCL system at runtime. Kernels such as user kernels 111 in FIG. 4 may be placed in the partial reconfiguration blocks 550, such that the kernels may be removed, added, or swapped via a partial reconfiguration, rather than requiring downtime from other components of the integrated circuit. In particular, this may include changing the number of replicated copies of each kernel, removing an existing kernel from a partial reconfiguration block, adding a new kernel to an available location in a partial reconfiguration block, or any combination thereof. Doing this enhances the performance of a machine-implemented program that is executed on the integrated circuit, even when resources are limited. While two partial reconfiguration blocks 550 are shown in FIG. 5, one of ordinary skill in the art will understand that a design of a chip may include any number of partial reconfiguration blocks of any size.

Examples of how kernels may be swapped in and out dynamically using partial reconfiguration are described in U.S. patent application Ser. No. 13/715,716, which is incorporated herein by reference in its entirety. In particular, the partial reconfiguration blocks 550 allow for a part of the integrated circuit to be reconfigured while the rest of the integrated circuit continues to operate. As shown in FIG. 5, the use of the configurable channel topology with partial reconfiguration blocks allows for new streaming topologies to swap various kernels in and out of the virtual fabric 200.

Figure 6:
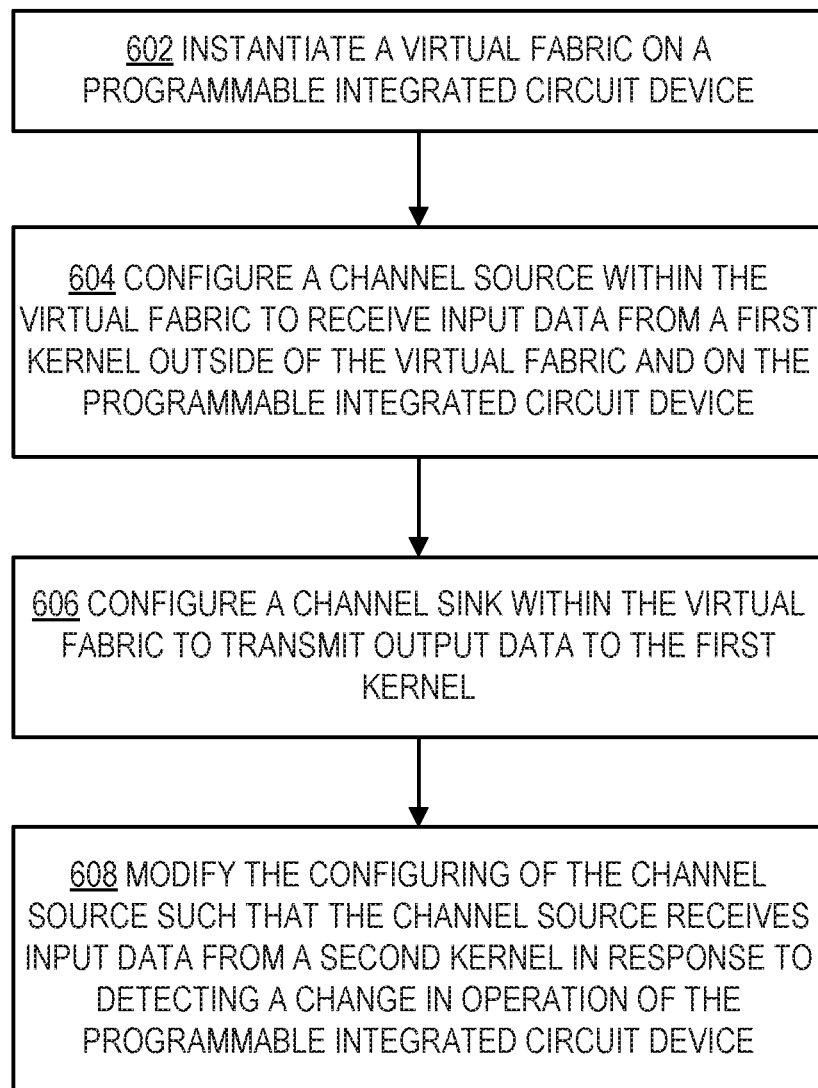
FIG. 6 shows an illustrative flow diagram of a process for configuring a programmable integrated circuit device, in accordance with some embodiments of the present disclosure.

FIG. 6 shows an illustrative flow diagram of a process 600 for configuring a programmable integrated circuit device.

At 602, a virtual fabric is instantiated on a programmable integrated circuit device. One or more virtual fabrics may be precompiled and represented using one or more high-level language representations. Each virtual fabric may be a high-level language representation of a coarse-grained virtual FPGA including an interconnect network and a number of function blocks that represent various combinations of logic elements. The interconnect network and the function blocks may be implemented on top of a physical FPGA having a relatively larger number of individual logic elements. As described herein, multiple basic blocks may be configured within the virtual fabric, as well as interconnections that provide connectivity between the basic blocks.

Each basic block may include a channel source, a channel buffer, or a channel sink, for example. In some embodiments, the virtual fabric includes a set of basic blocks, including a first subset that includes channel sources, a second subset that includes channel sinks, and a third subset that includes channel buffers. In particular, at least one channel buffer may form a first-in-first-out memory between one of the channel sources and one of the channel sources. In some embodiments, the number of channel sources is greater than or equal to the number of outputs on the kernels on the programmable integrated circuit device. Moreover, the number of channel sinks may be greater than or equal to a number of inputs on the kernels that are on the programmable integrated circuit device.

At 604, a channel source is configured within the virtual fabric to receive input data from a first kernel that is outside of the virtual fabric and on the programmable integrated circuit device. In an example, as shown and described in relation to FIG. 4, the connection 405 carries data from the user kernel 108a to a channel source in the virtual fabric 200. In some embodiments, the configuring of the channel source occurs at runtime.

At 606, a channel sink is configured within the virtual fabric to transmit output data to the first kernel. In the example shown in FIG. 4, the connection 407 carries data from a channel sink in the virtual fabric 200 to the user kernel 108a. In some embodiments, the configuring of the channel sink occurs at runtime.

At 608, the configuring of the channel source is modified such that the channel source receives input data from a second kernel in response to detecting a change in operation of the programmable integrated circuit device. In particular, the change in operation may correspond to a change in mode, such as a change between a print mode and a scan mode in a multi-function printers, copiers, and/or scanners. In this case, the flow of data and the image processing steps may be different in the different modes, but certain steps may be shared or reused across modes, optionally in a different order. In this manner, the topology of the communication between the different functions may be updated by modifying the configuration of the channel source. Additionally or alternatively, the configuring of the channel sink is modified by configuring the channel sink to transmit output data to the second kernel or to a different kernel than the kernel that transmits data to the channel source. In general, any modification to the connections between the basic blocks (including the channel sinks, channel buffers, and channel sources) and the kernels would result in a change in the communication topology of the virtual fabric.

In some embodiments, the first kernel, the second kernel, or both are in a set of multiple kernels that are included in a partial reconfiguration block, such as the partial reconfiguration blocks 550 shown in FIG. 5. The partial reconfiguration blocks 550 allow for the plurality of kernels to be removed, added, or exchanged when the configuring of the channel source and/or channel sink is modified. In some embodiments, another partial reconfiguration block includes another plurality of kernels that process data when the configuration of the channel sink and/or channel source are modified.

Figure 7:
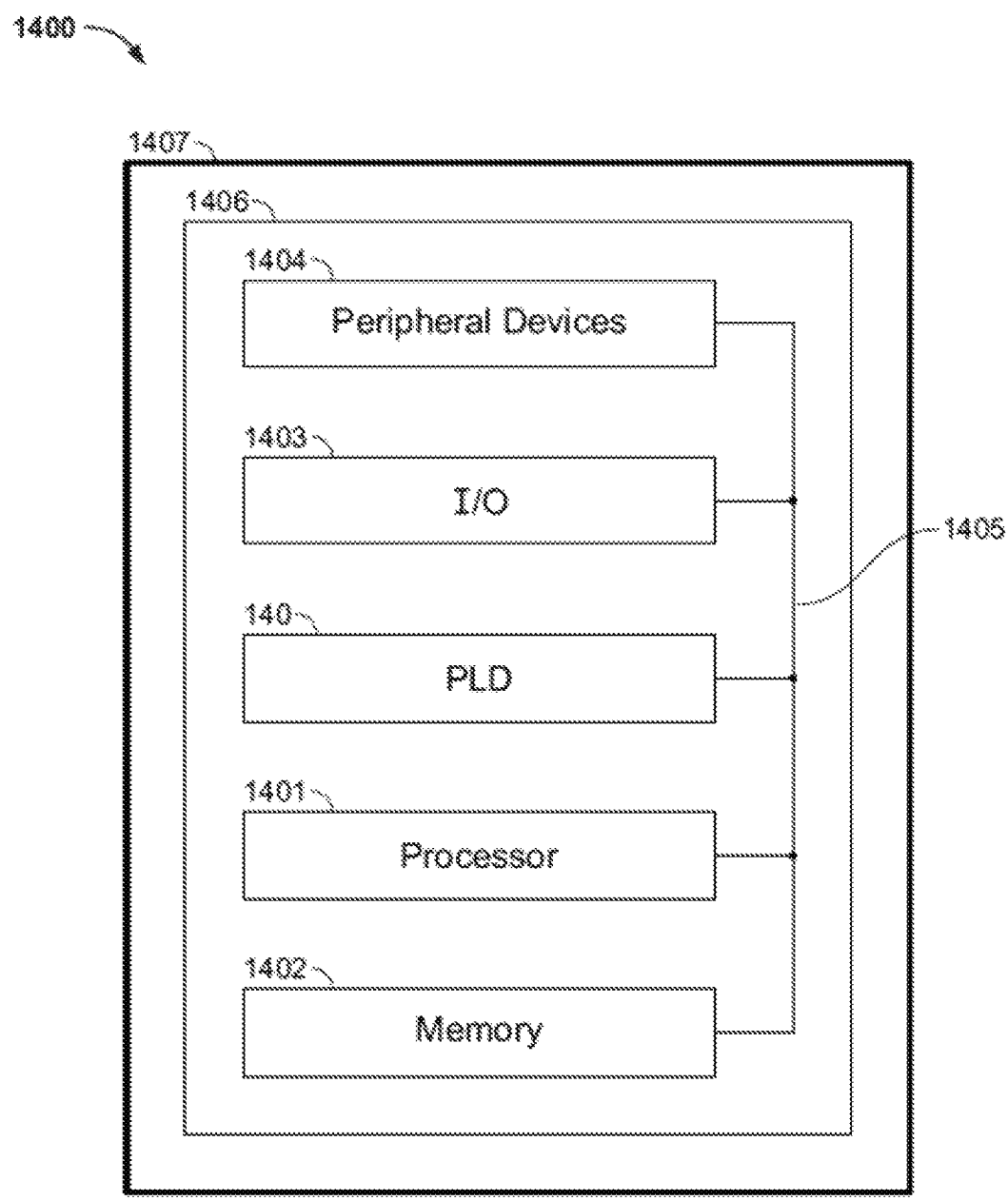
FIG. 7 is a simplified block diagram of an illustrative system employing a programmable logic device incorporating the present disclosure.

FIG. 7 is a simplified block diagram of an illustrative system employing a programmable logic device (PLD) 1400 incorporating the present disclosure. A PLD 1400 programmed according to the present disclosure may be used in many kinds of electronic devices. One possible use is in a data processing system 1400 shown in FIG. 7. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

PLD 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 1400 can be configured as a processor or controller that works in cooperation with processor 1401. PLD 1400 may also be used as an arbiter for arbitrating access to a shared resource in the system. In yet another example, PLD 1400 can be configured as an interface between processor 1401 and one of the other components in the system. It should be noted that the system shown in FIG. 7 is only exemplary, and that the true scope and spirit of the invention should be indicated by the following claims.

Various technologies can be used to implement PLDs 1400 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A programmable integrated circuit device comprising:
   virtual programmable logic circuitry formed in physical programmable logic circuitry of the programmable integrated circuit device; and
   a channel sink configurable to output data to a first kernel during a first operation mode, wherein a configuration of the channel sink is configurable to be modified to output data to a second kernel based at least in part on a change in operation of the programmable integrated circuit device from the first operation mode to a second operation mode.

2. The programmable integrated circuit device of claim 1, wherein the first kernel and the second kernel are outside of the virtual programmable logic circuitry and on the programmable integrated circuit device.

3. The programmable integrated circuit device of claim 1, wherein the first kernel and the second kernel are configured to be included in a first partial reconfiguration block of the programmable integrated circuit.

4. The programmable integrated circuit device of claim 3, wherein the first partial reconfiguration block is outside of the virtual programmable logic circuitry and on the programmable integrated circuit device.

5. The programmable integrated circuit device of claim 1, wherein the virtual programmable logic circuitry comprises the channel sink.

6. The programmable integrated circuit device of claim 1, comprising a channel source configurable to receive input data from the first kernel during the first operation mode, wherein the configuration of the channel source is modified to receive input data from the second kernel or a third kernel based at least in part on the change in operation of the programmable integrated circuit device from the first operation mode to the second operation mode.

7. The programmable integrated circuit device of claim 6, wherein the virtual programmable logic circuitry comprises the channel source.

8. The programmable integrated circuit device of claim 1, wherein modification of the configuration of the channel sink results in a change to a communication topology of the virtual programmable logic circuitry.

9. A method, comprising:
   configuring a channel sink within virtual programmable logic circuitry configured in physical programmable logic circuitry of a programmable integrated circuit device to output data to a first kernel; and
   modifying a configuration of the channel sink to output data to a second kernel in response to a change in operation of the programmable integrated circuit device.

10. The method of claim 9, wherein the virtual programmable logic circuitry is programmed on programmable logic circuitry of the programmable integrated circuit device.

11. The method of claim 9, wherein the programmable integrated circuit device comprises a partial reconfiguration block that enables the first kernel to be removed or modified during the change in operation of the programmable integrated circuit device.

12. The method of claim 11, wherein the partial reconfiguration block comprises the second kernel after the change in operation.

13. The method of claim 9, comprising:
   configuring a channel source within the virtual programmable logic circuitry on the programmable integrated circuit device to receive input data from the first kernel; and
   in response to the change in operation of the programmable integrated circuit device, modifying a configuration of the channel source to receive input data from the second kernel or a third kernel.

14. The method of claim 9, wherein the first kernel and the second kernel are outside of the virtual programmable logic circuitry and on the programmable integrated circuit device.

15. A programmable integrated circuit device comprising:
   virtual programmable logic circuitry programmed in programmable logic circuitry of the programmable integrated circuit device; and
   a channel source configurable to receive input data from a first kernel during a first operation mode, wherein a configuration of the channel source is configurable to be modified to receive input data from a second kernel based at least in part on a change in operation of the programmable integrated circuit device from the first operation mode to a second operation mode.

16. The programmable integrated circuit device of claim 15, comprising a channel sink configurable to output data to the first kernel during the first operation mode, wherein a configuration of the channel sink is configurable to be modified to output data to the second kernel based at least in part on the change in operation of the programmable integrated circuit device from the first operation mode to the second operation mode.

17. The programmable integrated circuit device of claim 16, wherein the configuration of the channel source and the configuration of the channel sink are configured to modified during runtime.

18. The programmable integrated circuit device of claim 15, comprising a plurality of kernels other than the first kernel and second kernel, wherein the plurality of kernels is configured to process data during the change in operation.

19. The programmable integrated circuit device of claim 15, wherein the programmable integrated circuit device comprises a field-programmable gate array (FPGA).

20. The programmable integrated circuit device of claim 15, wherein the virtual programmable logic circuitry comprises a representation of a virtual programmable integrated circuit device.

* * * * *